(12) United States Patent
Donofrio

(10) Patent No.: US 7,897,419 B2
(45) Date of Patent: Mar. 1, 2011

(54) COLOR CORRECTION FOR WAFER LEVEL WHITE LEDS

(75) Inventor: Matthew Donofrio, Raleigh, NC (US)

(73) Assignee: Cree, Inc., Durham, NC (US)

(*) Notice: Subject to any disclaimer, the term of this patent is extended or adjusted under 35 U.S.C. 154(b) by 149 days.

(21) Appl. No.: 12/317,528

(22) Filed: Dec. 23, 2008

(65) Prior Publication Data

US 2010/0155750 A1    Jun. 24, 2010

(51) Int. Cl.
*H01L 21/00*    (2006.01)
*H01L 33/00*    (2006.01)

(52) U.S. Cl. ............................. 438/27; 438/28; 438/29; 257/88; 257/89; 257/98

(58) Field of Classification Search ................ 438/22, 438/26, 27, 28, 29, 39; 257/79, 88, 89, 98, 257/99, 100
See application file for complete search history.

(56) References Cited

U.S. PATENT DOCUMENTS

| | | | |
|---|---|---|---|
| 4,946,547 A | 8/1990 | Palmour et al. | 156/643 |
| 5,200,022 A | 4/1993 | Kong et al. | 156/612 |
| RE34,861 E | 2/1995 | Davis et al. | 437/100 |
| 5,554,911 A * | 9/1996 | Nakayama et al. | 313/504 |
| 5,949,188 A * | 9/1999 | Leising et al. | 313/505 |
| 6,117,529 A * | 9/2000 | Leising et al. | 428/209 |
| 6,541,130 B2 * | 4/2003 | Fukuda | 428/690 |
| 6,576,931 B2 * | 6/2003 | Furukawa et al. | 257/98 |
| 6,878,297 B1 * | 4/2005 | Berger et al. | 216/17 |
| 7,518,141 B2 * | 4/2009 | Nakamura | 257/40 |
| 7,667,388 B2 * | 2/2010 | Ryu | 313/504 |

(Continued)

FOREIGN PATENT DOCUMENTS

EP    11980106 A2    4/2002

(Continued)

OTHER PUBLICATIONS

U.S. Appl. No. 11/656,759, filed Jan. 22, 2007.

(Continued)

*Primary Examiner*—Kevin M Picardat
(74) *Attorney, Agent, or Firm*—Koppel, Patrick, Heybl & Dawson

(57) ABSTRACT

A method for fabricating a plurality of LED chips comprises providing a plurality of LEDs and forming a plurality of spacers each of which is on at least one of the LEDs. Coating the LEDs with a conversion material, each of the spacers reducing the amount of conversion material over its one of the LEDs. This reduction causes the plurality of LED chips to emit a wavelength of light in response to an electrical signal that is within a standard deviation of a target wavelength. LEDs, LED chips and LED chip wafers are fabricated using the method according to the present invention. One embodiment of an LED chip wafer according to the present invention comprises a plurality of LEDs on a wafer and a plurality of a spacers, each of which is on a respective one of the LEDs. A conversion material at least partially covers the LEDs and spacers, with at least some light from the LEDs passing through the conversion material and is converted. The spacers cause the LED chips to emit light having a wavelength within a standard deviation compared to the similar LED chips without the spacers where at least some of the LED chips emit light a wavelength of light outside the standard deviation.

40 Claims, 7 Drawing Sheets

U.S. PATENT DOCUMENTS

| | | |
|---|---|---|
| 2002/0171911 A1* | 11/2002 | Maegawa .................... 359/308 |
| 2003/0089918 A1 | 5/2003 | Hiller et al. |
| 2004/0233139 A1 | 11/2004 | Asano et al. |
| 2006/0061259 A1 | 3/2006 | Negley |
| 2006/0099449 A1* | 5/2006 | Amano et al. ............... 428/690 |
| 2006/0258028 A1 | 11/2006 | Paolini et al. |
| 2008/0173886 A1 | 7/2008 | Cheon et al. |
| 2008/0179611 A1 | 7/2008 | Chitnis et al. |
| 2009/0173957 A1* | 7/2009 | Brunner et al. ............... 257/98 |
| 2010/0081218 A1* | 4/2010 | Hardin .......................... 438/7 |

FOREIGN PATENT DOCUMENTS

| | | |
|---|---|---|
| EP | 1811581 A2 | 7/2007 |
| EP | 1855320 A1 | 11/2007 |
| EP | 1975685 A1 | 10/2008 |
| WO | 2007049187 A1 | 5/2007 |

OTHER PUBLICATIONS

U.S. Appl. No. 11/899,790, filed Sep. 7, 2007.
U.S. Appl. No. 61/072,546, filed Mar. 31, 2008.
Cree® EZ1000™ LEDs Data Sheet, Cree's EZBright™ LEDs, 2007.
Cree® EZ700™ LEDs Data Sheet, Cree'S EZBright™ LEDs, 2007.
Cree® EZ400™ LEDs Data Sheet, Cree'S EZBright™ LEDs.pp. 1-5, 2007.
Cree® EZBright290™ LEDs Data Sheet, Cree's EZBright™ LEDs, 2007.
PCT International Search Report and Written Opinion from PCT/US2009/006625, Date: Sep. 6, 2010.

* cited by examiner

COLOR CORRECTION FOR WAFER LEVEL WHITE LEDS

BACKGROUND OF THE INVENTION

1. Field of the Invention

This invention relates to methods for fabricating sold state emitters and in particular methods for conversion material coating of solid state emitters at the wafer level.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; Cree® Inc. EZBrigh™ LEDs, XThin™ LEDs, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

One conventional method for coating an LED with a phosphor layer utilizes a syringe or nozzle for injecting a conversion material (e.g. phosphor) mixed with epoxy resin or silicone polymers over the LED. Using this method, however, the phosphor layer's geometry and thickness can be difficult to control. As a result, light emitting from different coated LEDs can vary, and light emitted at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, it can be difficult to control the geometry and layer thickness of the phosphor containing polymer using the stencil method. The stenciling composition may not fully fill the stencil opening such that the resulting layer is not uniform. The phosphor containing composition can also stick to the stencil opening which reduces the amount of composition remaining-on the LED. The stencil openings may also be misaligned to the LED. These problems can result in LEDs having non-uniform color temperature and LEDs that are difficult to consistently reproduce with the same or similar emission characteristics.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

There has been recent interest in coating LEDs at the wafer level instead of the chip level to reduce the cost and complexity of fabrication. LEDs across a wafer can have different emission characteristics or color spread. FIG. 1 shows one example of a wavelength emission map 10 for a wafer of blue emitting LEDs showing wavelength variations across the wafer, and each wafer can have its own unique emission map. In the map shown, the wavelength distribution is in the range of approximately 445 to 460 nm, although other wafers can experience different distributions in different wafer areas. This distribution can result from different factors such as variations in the epitaxial material during growth of the LEDs, or from variations in the flatness (i.e. bow) of the growth substrate.

The wafer can be coated with a conversion material (i.e. phosphor) using one of the methods described above, and FIG. 2 shows a conversion material thickness map 20 following coating. In some fabrication processes the coating can be planarized using known methods. The thickness of the coating can vary across the wafer due to different factors such as variations in the thickness of the underlying wafer and in planarizing variations. In the embodiment shown the wafer experiences a total thickness variation of approximately 3 μm. The wavelength emission variations of the LEDs and thickness variations of the conversion material across the wafer can result in a spread of emission wavelengths or color points of the LED chips singulated from the wafer. This spread can exacerbate by phosphor loading variations or concentrations across the wafer.

The human eye is relatively sensitive to variations in emission wavelengths and can detect relatively small differences in emission wavelengths or color. Perceptible variations in color emitted by packages designed to emit a single color of light can reduce customer satisfaction and reduce overall acceptance of LED packages for commercial uses. In an effort to provide LEDs that emit light of the same or similar wavelength, the LEDs can be tested and sorted by color or brightness. This process is generally known in the art as binning. Each bin typically contains LEDs from one color and brightness group and is typically identified by a bin code. White emitting LEDs can be sorted by chromaticity (color) and luminous flux (brightness). Color LEDs can be sorted by dominant wavelength, and luminous flux, or in the case of certain colors such as royal blue, by radiant flux. LEDs can be shipped, such as on reels, containing LEDs from one bin and are labeled with the appropriate bin code.

FIG. 3 shows one example of a chromaticity region map 30 plotted on the 1931 CIE Curve, with each of these regions corresponding to a particular chromaticity of white LEDs. The regions are shown surrounding the black body curve or black body locus (BBL) and each of these regions is designed to designate chromaticity variations that are within acceptable ranges to the human eye. For example, region WF designates a particular region having substantially imperceptible chromaticity variations such that LEDs emitting within this region would be binned together.

FIG. 4 shows one example of the distribution of emission characteristics for a sample batch of wafers with blue emitting LEDs, following coating with a conversion material. The region designations correspond to different chromaticity regions for a map, such as the one in FIG. 3. The majority of the coated LEDs emit in regions WC, WD, WG and WH, with the remaining LEDs emitting in other regions, some being outside the map regions. This variation in emission characteristics results from emission wavelength variations across the LED wafer and phosphor thickness variations, and the emission variations would require multiple different bins for the individual LEDs.

This binning process typically increases the manufacturing cost of LEDs by the overhead associated with the testing and separation of devices with different emission characteristics, and the formulation of the data and records surrounding this process. The greater the number of bins for a particular LED being manufactured, the greater the additional cost associated with the binning process. This in turn can result in increased end cost for the LEDs.

This binning process could be reduced if coated LEDs across the wafer emitted light closer to a target color point or wavelength. One method for measuring the target emission for LEDs is by standard deviation from a target color point or wavelength, with one example being deviation by MacAdam Ellipses on the CIE color region map as shown in FIG. 3. These ellipses are generally known in the art and are defined to establish the boundaries of how far colors of light can deviate from the target before a difference in the target light is perceived. MacAdam Ellipses are described as having "steps" or "standard deviations". For example, any point on the boundary of a "1-step" ellipse drawn around the target represents one standard deviation from the target. Specified tolerances for conventional lamps (incandescent or fluorescent) are within a 4-step MacAdam Ellipse. For LEDs to become more generally accepted by consumers for general lighting applications, they should be provided with emission characteristics within accepted specified tolerances, such as the 4-step MacAdam Ellipse. For some current manufacturing processes, the yield within a 4-step MacAdam Ellipse can be 20% or lower.

SUMMARY OF THE INVENTION

The present invention discloses new methods for fabricating semiconductor devices such as LED chips at the wafer level, and discloses LEDs, LED chips and LED chip wafers fabricated using the methods. One embodiment of a method according to the present invention for fabricating a plurality of LED chips comprises providing a plurality of LEDs and forming a plurality of spacers each of which is on at least one of the LEDs. The LEDs are then coated with a conversion material, with each of the spacers reducing the amount of conversion material over its one of the LEDs. The plurality of LED chips emit a wavelength of light in response to an electrical signal that is within a standard deviation of a target wavelength.

One embodiment of an LED chip wafer according to the present invention comprises a plurality of LEDs on a wafer and a plurality of spacers, each of which is on a respective one of the LEDs. A conversion material at least partially covers the LEDs and spacers, with at least some light from the LEDs passing through the conversion material and is converted. The spacers cause the LED chips to emit light having a wavelength within a standard deviation compared to the similar LED chips without the spacers where at least some of the LED chips emit a wavelength of light outside the standard deviation.

One embodiment of a light emitting diode (LED) chip according to the present invention comprises an LED and a spacer on the LED. A phosphor coating is included on the spacer and at least partially covering the LED so that at least some of the light emitted by the LED is converted by the phosphor. The spacer is transparent to light from the LED and has a volume that consumes space that would otherwise be occupied by the conversion material, thereby reducing the amount of phosphor coating over the LED so that the LED chip emits light at a desired wavelength.

One embodiment of an LED package according to the present invention comprises an LED chip having an LED with a contact and a spacer. The spacer is transparent to light from said LED. A conversion coating is included at least partially covering the LED and spacer, with the spacer having a volume that reduces the amount of phosphor coating over the LED so that the LED chip emits light at a desired wavelength. A package lead is included in electrical connection with the contact, and an encapsulation is included surrounding the LED chip and electrical connections.

These and other aspects and advantages of the invention will become apparent from the following detailed description and the accompanying drawings which illustrate by way of example the features of the invention.

DETAILED DESCRIPTION OF THE INVENTION

Figure 1:
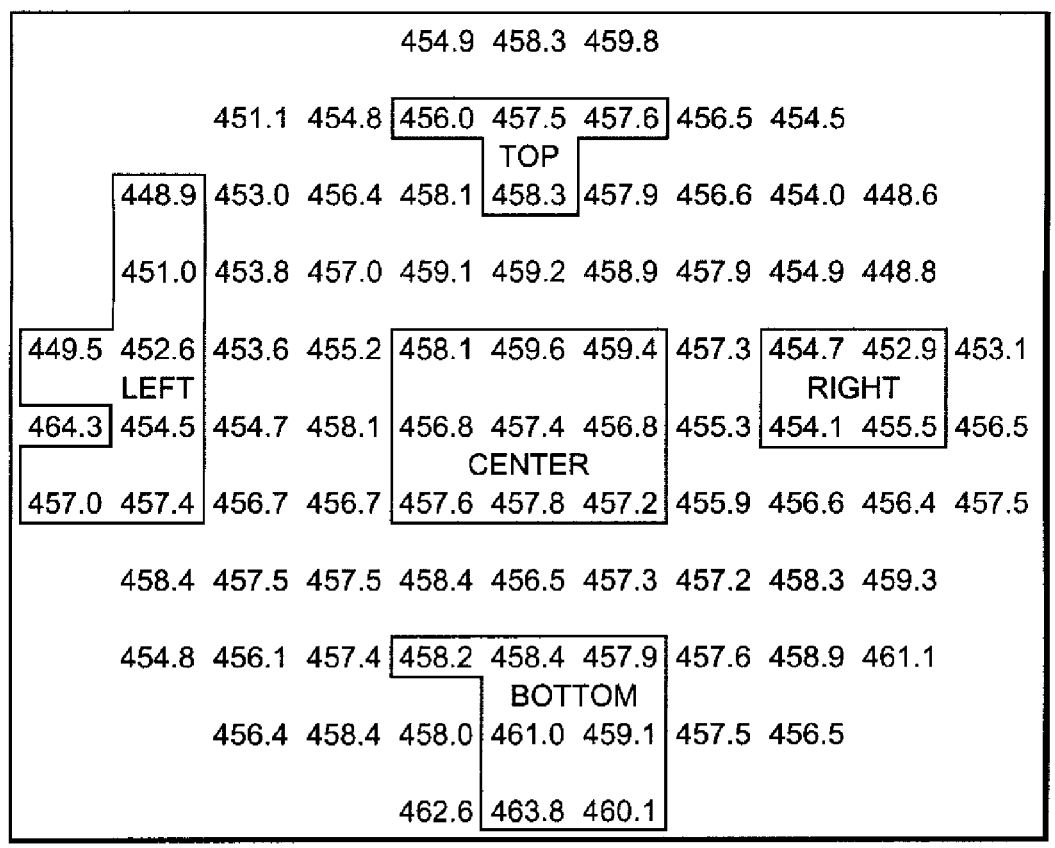
FIG. 1 shows one embodiment of a wavelength emission map across an LED wafer having blue emitting LEDs.
Figure 2:
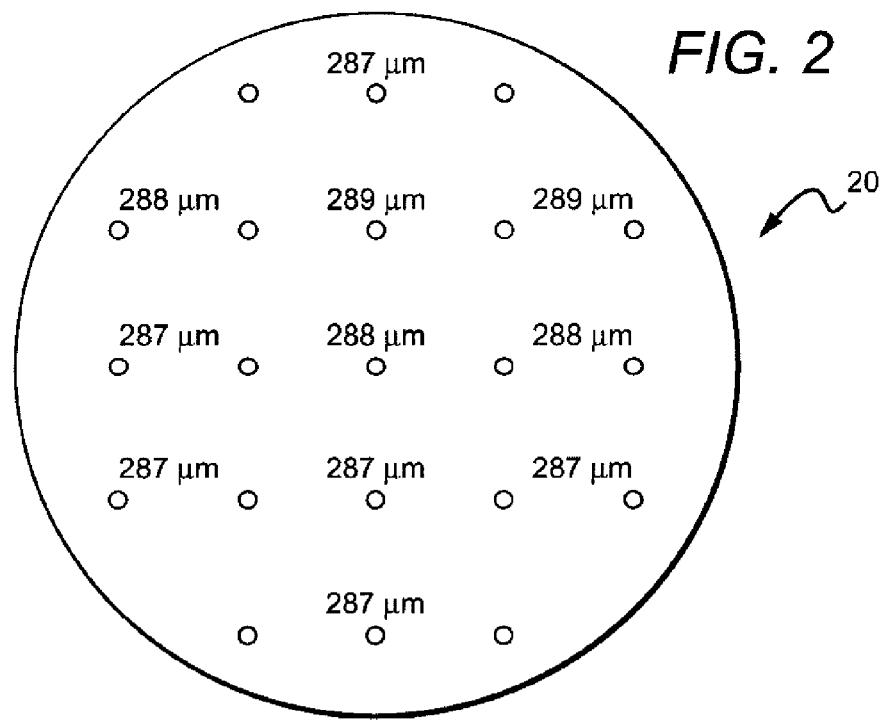
FIG. 2 shows one embodiment of a conversion material thickness map across an LED wafer.
Figure 3:
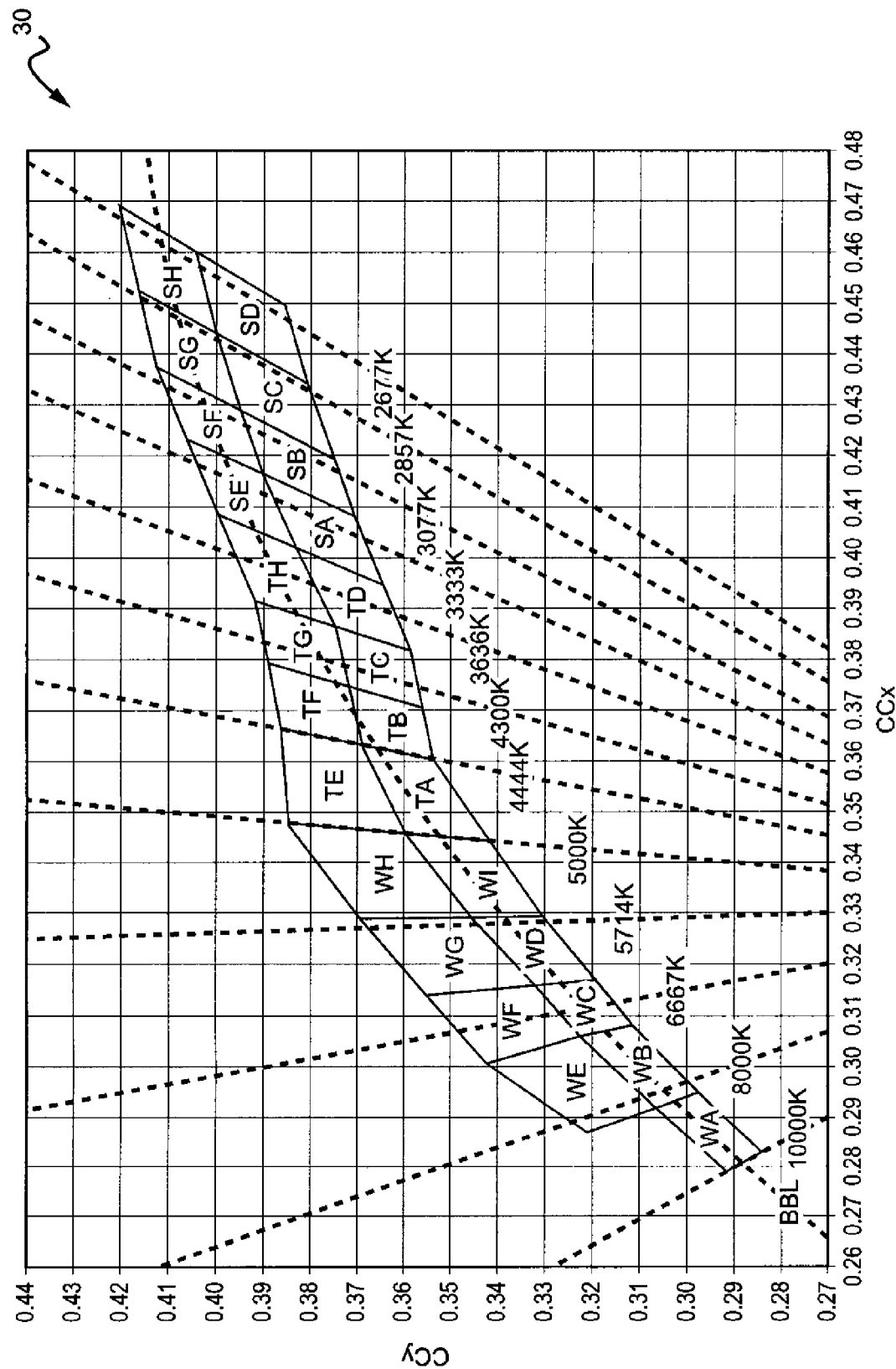
FIGS. 3 shows one embodiment of a chromacity region map plotted on a 1931 CIE curve.
Figure 4:
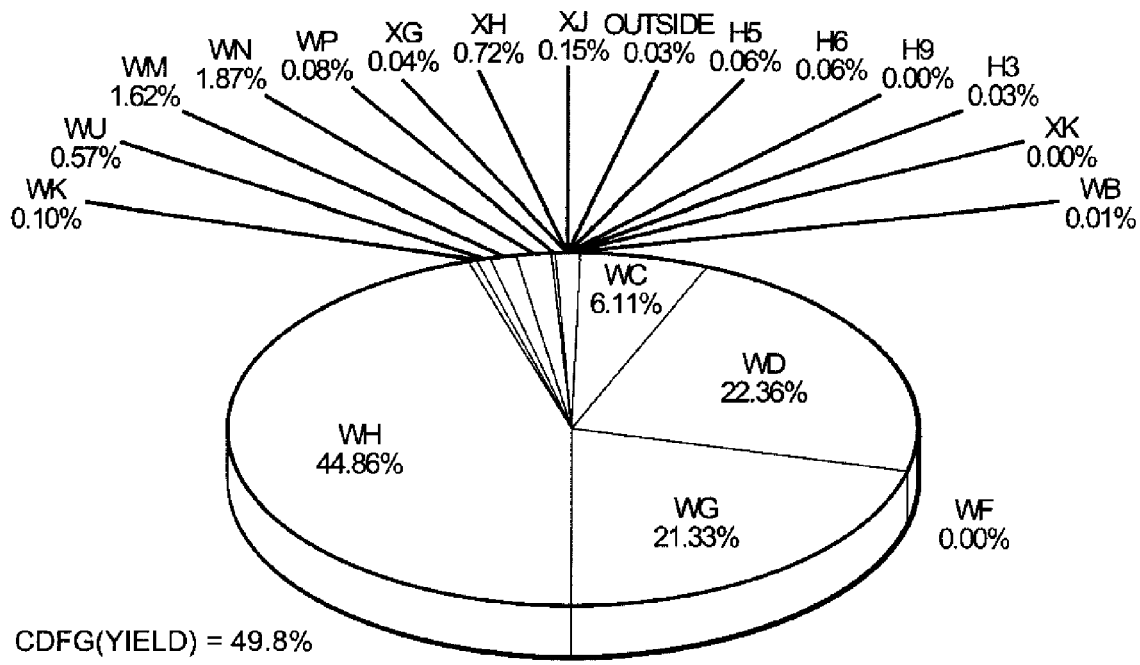
FIG. 4 is a graph showing distribution of emission characteristics for LEDs on an LED wafer prior to conversion material machining.

The present invention is directed to methods for controlling the emission characteristics of solid state emitters by altering the amount of conversion material over emitters, and is also directed to emitters fabricated using the methods. The present invention provides fabrication methods that are particularly applicable to wafer level fabrication of LEDs and altering the conversion material over particular LEDs at the wafer level to reduce or eliminate the variations in emission characteristics of LED chips across the wafer. The methods according to the present invention can also be used to alter the emission characteristics of individual LEDs or groups of LEDs singulated from a wafer.

In one embodiment a wafer can comprise a plurality of LEDs having a dominant emission wavelength that falls within a range of wavelengths. As mentioned above, the LEDs across the wafer can emit at different wavelengths due to factors such as variations in the epitaxial material during growth of the LEDs, or from variations in the flatness of the growth substrate. If the wafer is covered by a uniform conversion material layer the resulting LED chips singulated from the wafer can also emit at different wavelengths or colors. This color variation of the LED chips, and resulting binning requirements, can be reduced or eliminated at the wafer level by selectively applying a spacer over particular ones of the LEDs before the conversion material layer is applied. The spacer can have a different thickness, or volume, depending on the emission wavelength of the LED or LEDs. When the uniform conversion layer is then applied, those LEDs or groups of LEDs with a spacer will have a reduction in conversion material corresponding to the volume of the spacer. This reduction in conversion material results in the LED chip having less of its light converted by the conversion material, which compensates for the different wavelength emitted by the LED. This can result in the LED chips across the wafer emitting closer to a target emission wavelength.

The present invention can be used to fabricate different LED chips but is particularly applicable to fabricate white emitting LED chips. In one such embodiment a wafer can comprise a plurality of blue emitting LEDs having a dominant emission wavelength for example of between approximately 440 to 480 nm. A map can be generated showing the locations the emission wavelengths of the LEDs across the wafer and spacers can be deposited on the different LEDs or regions of LEDs, with the spacer having a different volume over the particular LEDs depending on the emission wavelength. The wafer can then be coated with a conversion material layer, such as cerium doped YAG in a binder. In some embodiments the conversion layer can then be planarized. LEDs singulated from the wafer emit white light closer to a target emission wavelength, such as to a chromaticity region on a CIE Curve, or within a standard deviation by MacAdam ellipses.

As described below, the spacers according to the present invention can comprise many different materials and can take many different shapes over the LEDs. The spacers can also be applied to the LEDs or groups of LEDs using many different methods. For those wafers where the LED wavelength emissions variations can be segregated to regions of multiple LEDs having the same or similar emission wavelengths, a spacer compound can be applied with the same thickness over the groups of LEDs in the regions.

The present invention is described herein with reference to certain embodiments but it is understood that the invention can be embodied in many different forms and should not be construed as limited to the embodiments set forth herein. In particular, the present invention is described below in regards to coating LEDs with a down-converter coating that typically comprises a phosphor loaded binder ("phosphor/binder coating"), but it is understood that the present invention can be used to coat LEDs with other materials for down-conversion, protection, light extraction or scattering. It is also understood that the phosphor binder can have scattering or light extraction particles or materials, and that the coating can be electrically active. The methods according to the present invention can also be used for coating other semiconductor devices with different materials. Additionally, single or multiple coatings and/or layers can be formed on the LEDs. A coating can include no phosphors, one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 5:
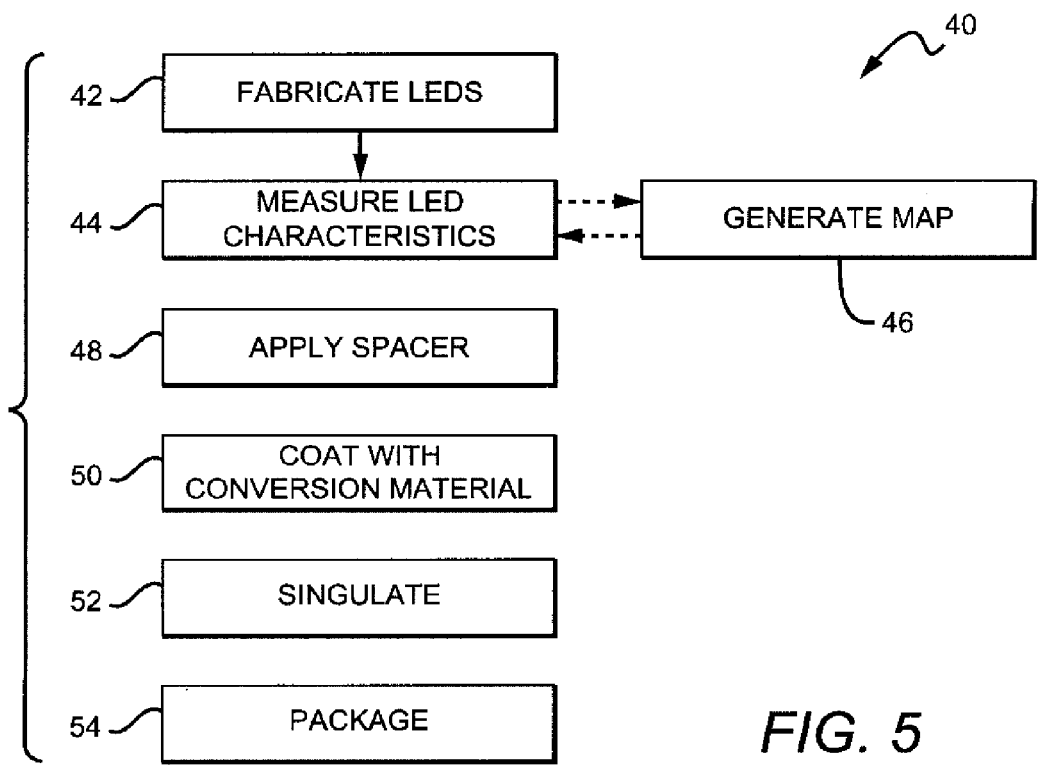
FIG. 5 is a flow diagram for one embodiment of a method for fabricating LED chips according to the present invention.

FIG. 5 shows one embodiment of method 40 according to the present invention for fabricating LEDs, and although steps are being shown in a particular order it is understood that the steps can occur in a different order and different steps can be used. The present method is described with reference to the fabrication of LEDs, but it is understood that it can be used to fabricate other solid state emitters and other semiconductor devices. In one embodiment the method 40 is used to fabricate white emitting LED chips that can comprise an LED coated by a conversion material.

In 42, LEDs are fabricated on a growth wafer or substrate, and the LEDs can have many different semiconductor layers arranged in different ways. The fabrication and operation of LEDs is generally known in the art and only briefly discussed herein. The layers of the LEDs can be fabricated using known processes with a suitable process being fabrication using metal organic chemical vapor deposition (MOCVD). The layers of the LEDs generally comprise an active layer/region sandwiched between first and second oppositely doped epitaxial layers, all of which are formed successively on the growth wafer or substrate ("wafer"). The LED layers can initially be formed as continuous layers across the substrate with the layers then partitioned or separated into individual LEDs. This separation can be achieved by having portions of the active region and doped layers etched down to the wafer to form the open areas between the LEDs. In other embodiments the active layer and doped layers can remain continuous layers on the wafer and can be separated into individual devices when the LED chips are singulated.

It is understood that additional layers and elements can also be included in each of the LEDs, including but not limited to buffer, nucleation, contact and current spreading layers as well as light extraction layers and elements. The active region can comprise single quantum well (SQW), multiple quantum well (MQW), double heterostructure or super lattice structures, and as is understood in the art, the oppositely doped layers are commonly referred to as n-type and p-type doped layers.

The LEDs may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers are gallium nitride (GaN) and the active region is InGaN. In alternative embodiments the n- and p-type layers may be AlGaN, aluminum gallium arsenide (AlGaAs) or aluminum gallium indium arsenide phosphide (AlGaInAsP).

The wafer can be made of many materials such as sapphire, silicon carbide, aluminum nitride (AlN), GaN, with a suitable wafer being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the wafer (as may be the case with some devices formed on sapphire). SiC wafers are available from Cree Research, Inc., of Durham, N.C. and methods for producing them are set forth in the scientific literature as well as in a U.S. Pat. Nos. Re. 34,861; 4,946,547; and 5,200,022.

Each of the LEDs can also have first and second contacts. The LEDs can have vertical geometry with a first contact on the substrate and a second contact on the LEDs top layer, which is typically a p-type layer. The first and second contacts can comprise many different materials such as Au, copper (Cu) nickel (Ni), indium (In), aluminum (Al) silver (Ag), or combinations thereof. In still other embodiments the contacts can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance. In the case of Group-III nitride devices, it is known that a thin semitransparent current spreading layer typically can cover some or the entire p-type layer. It is understood that the second contact can include such a layer which is typically a metal such as platinum (Pt) or a transparent conductive oxide such as indium tin oxide (ITO), although other materials can also be used.

It is understood that the present invention can also be used with LEDs having lateral geometry wherein both contacts are on the top of the LEDs. The present invention can also be used with flip-chip type LED chips that can be mounted to a submount having a mirror arranged to reflect LED light. The LEDs can also comprise different structures such as additional current spreading structures or grids.

In one embodiment, each of the LEDs can further comprise one or more pedestals each of which is provided to allow electrical contact to a respective one of the LED's contacts after phosphor coating of the LEDs. This embodiment is described in more detail below and in white chip patent applications U.S. patent application Ser. No. 11/656,759, and U.S. patent application Ser. No. 11/899,790, both entitled "Wafer Level Phosphor Coating Method and Devices Fabricated Utilizing Method", and both incorporated by reference as though fully set forth herein.

Following LED wafer level fabrication, in 44 the different characteristics of the LEDs can be measured such as operating voltage, leakage current, peak and dominant emission wavelength and intensity. For purposes of this invention, the measurements of particular interest are the emission wavelength and secondarily the emission intensity. Different measuring methods can be used and in one embodiment the LEDs can be probed by applying an electrical signal to each of LEDS causing them to emit light, and the output emission characteristics are measured. In different probing steps, the entire wafer can be activated and the output of LEDs measured, LEDs within different regions or groups can be activated and its output measured, or each LED can be individually activated and its output measured. This probing process can also identify defective LEDs that will not be further processed, thereby reducing the overall processing time and expense for the wafer.

The wafer can also be visually inspected for visible defects to identify LEDs with physical defects from fabrication that would result in the LEDs not functioning properly. A map of the defective LEDs can be generated with the defective LEDs being excluded from further probing and micromachining processes. By excluding the defective LEDs, the time and expense associated with processing the LED wafer can be reduced.

The method 40 can comprise the alternative step 46 of generating a map based on the results of visual inspection and probing. The map can show different characteristics such as the emission wavelengths of the LEDs across the wafer and the known good defective ones of the LEDs across the wafer. For example, a wafer of blue emitting LEDs can experience emission wavelength variations of approximately 450 to 460 nm. It is understood that different embodiments of methods according to the present invention can be completed without generating a wafer level LED visual and or emission characteristic map.

As discussed above, to more effectively compete with existing conventional lighting technologies, white LED technology should have color point or wavelength stability and reproducibility within selected bins or within a standard deviation by MacAdam ellipse (e.g. within a 4-step MacAdam ellipse). To achieve a tighter color point or wavelength spread across the wafer, LEDs according to the present invention are arranged so that the amount of conversion material deposited over the LEDs is controlled so that the resulting phosphor coated LED chip emits light within the standard deviation. For LEDs emitting at different wavelengths, the amount of conversion material over the LEDs can be varied to bring emission consistency between LED chips. One way that this is accomplished according to the present invention, is by reducing the volume of conversion material over the LEDs by a desired amount.

In 48, a spacer is applied to selective ones of the LEDs on the wafer and the spacer can have a different thickness or volume over different LEDs or groups of LEDs. Different factors can be considered to determine the spacer thickness or volume, with the primary factors being the emission wavelengths of the LED or groups of LEDs, the desired target emission for the end LED chips, the thickness of conversion material over the LEDs, and the concentration of conversion particles in the conversion material. Using different means of calculating, such as by computer with the appropriate software, the volume of the spacer over the different LEDs can be calculated. The thickness or volume of the spacer corresponds to a desired reduction in volume of the conversion material over the particular LED or groups of LEDs. This reduction causes less LED light to be converted by the conversion material causing the end LED chip to emit at a desired emission. That is, the spacer causes light from the LED to encounter or pass through less conversion material the greater the volume of the spacer over the LED. If because of the emission wavelength of the particular LED or groups of LEDs less conversion material is required, then the greater the thickness or volume of the spacer.

The spacer can comprise many different materials with the suitable spacer capable of consuming a volume of space over the LED or groups of LEDs during coating as described below, and also allowing at least partial transmission of light from the LED. In most embodiments the spacer comprises a material that is transparent to the particular wavelength of light from the LED so that it absorbs none or a nominal amount of LED light. In some embodiments the spacer can also comprise a material that is applied to the LED wafer in liquid form and is then curable, such as by heat, ultraviolet (UV), infrared (IR) or air curing. Suitable materials for the spacer layer can comprise clear silicones or epoxies. It is understood that many different materials can be used for the spacer layer that can hold a shape to over the LEDs during subsequent conversion coating, including various sol-ids, liquids and gasses.

Many different methods can be used for depositing the spacer on the wafer such as cartridge dispense or syringe dispense systems that can be programmed to dispense the appropriate amount of spacer material over each of the LEDs or groups of LEDs. As mentioned above, the amount of spacer material is primarily determined by the desired emission wavelength of end LED chips and the emission wavelength of the LED in the wafer. Different ones of the dispense methods can dispense the liquid spacer material to a nano-liter resolution, with certain resulting spacer layers being one to several microns thick, although it is understood that different spacer layers can be thinner or thicker.

The above spacer formation method involves depositing or forming a spacer in the particular location where it is desired, and forming at the desired thickness or volume. In other spacer formation methods the spacer material can be included across the wafer with the spacer material thinned where desired and removed in the areas where it is not needed using chemical or mechanical methods. Still in other embodiments, a photo patternable silicone or UV curable clear epoxy can be spray or spin coated on the wafer and then locally UV exposed in the regions where the epoxy is to remain one the wafer. This can be accomplished using a UV laser by rastering a spot on and off or using a shutter to block or unblock the UV laser so that it is applied only in the areas where the spacer layer is to remain. The unexposed portion of the spacer material can be dissolved or developed out with a wet chemical similar to standard lithography processes. Alternatively, flood exposure of the wafer and spacer material with a UV lamp can be used in conjunction with a mask that has apertures, and in some embodiments a different mask may be needed for different wafers. Following this process the unexposed portion can also be developed away.

As further described below, the spacer can take many different shapes over the individual LEDs or groups of LEDs. In one embodiment the spacer can comprise a substantially uniform layer across each of the LEDs, while in other embodiments it can comprise a non-uniform layer. In still other embodiments it can comprise different shapes such as hemispheric of pyramid shaped, or can comprise one or more cylindrical or multi-sided columns covering all or less than all of the particular LEDs. These are only some of the many shapes that the spacer can take, with the spacer having the desired volume to provide the desired reduction in the amount of conversion material over the LED.

In 50, the wafer is coated by a conversion material and in one embodiment the conversion material can comprise a phosphor/binder coating that covers each of the LEDs. The phosphor/binder coating can be applied using different known processes such as dispensing, electrophoretic deposition, electrostatic deposition, printing, jet printing or screen printing. In other embodiments the coating can be provided as a separately fabricated preform that can be bonded or mounted over the LEDs.

In one embodiment, the phosphor can be deposited over the wafer in a phosphor/binder mixture using spin coating. Spin coating is known in the art and generally comprises depositing the desired amount of binder and phosphor mixture at the center of the wafer and spinning the substrate at high speed. The centrifugal acceleration causes the mixture to spread to and eventually off the edge of the wafer, leaving a layer of phosphor/binder mixture on the wafer. Final layer thickness and other properties depend on the nature of the mixture (viscosity, drying rate, percent phosphor, surface tension, etc.) and the parameters chosen for the spin process. For large wafers it may be useful to dispense the phosphor/binder mixture over the substrate before spinning the substrate at high speed.

In other embodiments, the phosphor is deposited on the wafer using known electrophoretic deposition methods. The wafer and its LEDs are exposed to a solution containing phosphor particles suspended in a liquid. An electrical signal is applied between the solution and the LEDs which creates an electrical field that causes the phosphor particles to migrate to and deposit on the LEDs. The process typically leaves the phosphor blanketed over the LEDs in powder form. A binder can then be deposited over the phosphor with the phosphor particles sinking into the binder to form the coating. The binder coating can be applied using many known methods and in one embodiment, the binder coating can be applied using spin coating.

The phosphor/binder coating can then be cured using many different curing methods depending on different factors such as the type of binder used. Different curing methods include but are not limited to heat, ultraviolet (UV), infrared (IR) or air curing. Different materials can be used for the binder, with materials preferably being robust after curing and substantially transparent in the visible wavelength spectrum. Suitable material include silicones, epoxies, glass, inorganic glass, spin-on glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. In other embodiments, the binder material can be textured or can be engineered to be index matched with the features such as the chip (semiconductor material) and growth substrate, which can reduce total internal reflection (TIR) and improve light extraction. Similarly, the surface of the LEDs can be textured to improve light extraction.

The coating preferably contains one or more light conversion materials that absorb light from the LEDs and re-emits the light at a different wavelength, such as down-converting the light to a longer wavelength. Many different conversion materials can be used, with a suitable material being a phosphor. Different factors determine the amount of LED light that will be absorbed by the phosphor in the final LED chips, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Many different phosphors can be used in the coating according to the present invention. The present invention is particularly adapted to LED chips emitting white light. In one embodiment according to the present invention LEDs emit light in the blue wavelength spectrum and the phosphor absorbs some of the blue light and re-emits yellow. The LED chips emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:

$Tb_{3-x}RE_xO_{12}$:Ce(TAG); RE=Y, Gd, La, Lu; or $Sr_{2-x-y}Ba_xCa_ySiO_4$:Eu.

First and second phosphors can also be combined for higher CRI white of different white hue (warm white) with the yellow phosphors above combined with red phosphors. Different red phosphors can be used including:

$Sr_xCa_{1-x}S$:Eu, Y; Y=halide;

$CaSiAlN_3$:Eu; or $Sr_{2-y}Ca_ySiO_4$:Eu

Other phosphors can be used to create saturated color emission by converting substantially all light to a particular color. For example, the following phosphors can be used to generate green saturated light:

$SrGa_2S_4$:Eu;

$Sr_{2-y}Ba_ySiO_4$:Eu; or $SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion, and has acceptable Stokes shift:

YELLOW/GREEN $(Sr,Ca,Ba) (Al,Ga)_2S_4$:$Eu^{2+}$ $Ba_2(Mg, Zn) Si_2O_{7:Eu}{}^{2+}$ $Gd_{0.46}Sr_{0.31}Al_{1.23}O_xF_{1.38}$:$Eu^{2+}{}_{0.06}$ $(Ba_{1-x-y}Sr_xCa_y) SiO_4$:Eu $Ba_2SiO_4$:$Eu^{2+}$

RED $Lu_2O_3$:$Eu^{3+}$ $Sr_{2-x}La_x) (Ce_{1-x}Eu_x)O_4$ $Sr_2Ce_{1-x}Eu_xO_4$ $Sr_{2-x}Eu_xCeO_4$ $SrTiO_3$:$Pr^{3+}$, $Ga^{3+}$ $CaAlSiN_3$:$Eu^{2+}$ $Sr_2Si_5N_8$:$Eu^{2+}$

Different sized phosphor particles can be used including but not limited to 10-100 nanometer(nm)-sized particles to 20-30 μm sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 μm. In other embodiments, the coating can comprise different types of phosphors or can comprise multiple phosphor coatings for monochromatic or polychromatic light sources.

The coating can also have different concentrations or loading of phosphor materials in the binder, with a typical concentration being in range of 30-70% by weight. In one embodiment, the phosphor concentration is approximately 65% by weight, and is preferably uniformly dispersed throughout the binder. Still in other embodiments the coating can comprise multiple layers of different concentrations or types of phosphors, and the multiple layers can comprise different binder materials. In other embodiments one or more of the layers can be provided without phosphors with one or more being substantially transparent to the LED light After the initial coating of the LEDs, further processing may be needed such as thinning or planarization of the phosphor/binder coating to expose structure below (such as pedestals) or to reduce the overall thickness of the coating. Many different thinning processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. The coating can have many different thicknesses following planarization, with a range of thicknesses in one embodiment being 1 to 100 μm. In still another embodiment, the suitable range of thicknesses is 30 to 50 μm.

The spacer and planarization according to the present invention are designed to leave the appropriate amount of conversion material on the LEDs so that no further processing is needed for the LED chips to emit within the standard deviation of the target wavelength, and the LED chips are ready for singulating. Alternative methods may provide for additional processing and in some of these embodiments, the output characteristics of the LEDs on the wafer can again be measured, such as by probing to determine if the LED chips now emit the desired wavelength characteristics or within an acceptable deviation from the target emission. As above, a map of these characteristics can be generated. If certain ones of the LED chips still do not emit at an acceptable wavelength, the wafer can undergo further processing. This can include micromachining as described in U.S. Provisional Patent Application Ser. No. 61/072,546, entitled "Emission Tuning Methods and Devices Fabricated Utilizing Methods" incorporated by reference as though fully set forth herein. It is understood that other methods can also be used to alter the amount of conversion material over the LED chips, either by addition additional conversion material or by removing conversion material.

In 52 the individual LED chips can be singulated from the wafer using known methods such as dicing, scribe and breaking, or etching. This can occur directly from the coating and planarization 50 or after the second probing if the emission of the LEDs is acceptable and no further micromachining is needed. The singulating process separates each of the LED chips with each having substantially the same emission characteristics. This allows for reliable and consistent fabrication of LED chips having similar emission characteristics. When the LEDs are singulated, some of the phosphor/binding coating can remain on the side surfaces of the LED so that LED light emitting out the side surfaces is also converted. This reduces or eliminates LED light leakage out the side surfaces of the singulated LED chips.

In 54, the LED chips can be packaged, which can comprise mounting the LED chips in a package, or to a submount or printed circuit board (PCB). This is done without the need for further processing to add or remove phosphor. In one embodiment the package/submount/PCB can have conventional package leads with the pedestals electrically connected to the leads. A conventional encapsulation can then surround the LED chip and electrical connections. In another embodiment, the LED chip can be enclosed by a hermetically sealed cover with an inert atmosphere surrounding the LED chip at or below atmospheric pressure.

It is understood that additional steps can be included in the different embodiments of the methods according to the present invention. It is also understood that methods according to the present invention need not include all of the steps in the method 40 and that methods according to the present invention can be used for processing less than a full wafer of LEDs. For example, the methods can be used to process groups of LEDs separated from a wafer. The group can have LEDs emitting at many different wavelengths or at substantially the same wavelength. In other embodiments, the spacer method can be used in processing a single LED either before or after mounting in a package. In one embodiment, the LED chip can be mounted in a package and a spacer can be applied to the LED chip depending on the desired emission characteristics for the package. The conversion material can then be applied using one of the methods described above or the conversion material can be applied as a preform.

Methods according to the present invention can be utilized for fabricating many different devices, and FIGS. 6a through 6e show one embodiment of an LED wafer 90 processed according to the present invention. It is understood, however, that the present invention can be utilized to process many different LEDs embodiments and that individual LEDs or smaller groups of LEDs can be processed similarly to the wafer level LED. Examples of different embodiments of LEDs that can be fabricated according to the invention include commercially available EZBright™ LED chips provided by Cree, Inc. (e.g. EZ1000, EZ700, EZ600, EZ400, EXBright290).

Figure 6A:
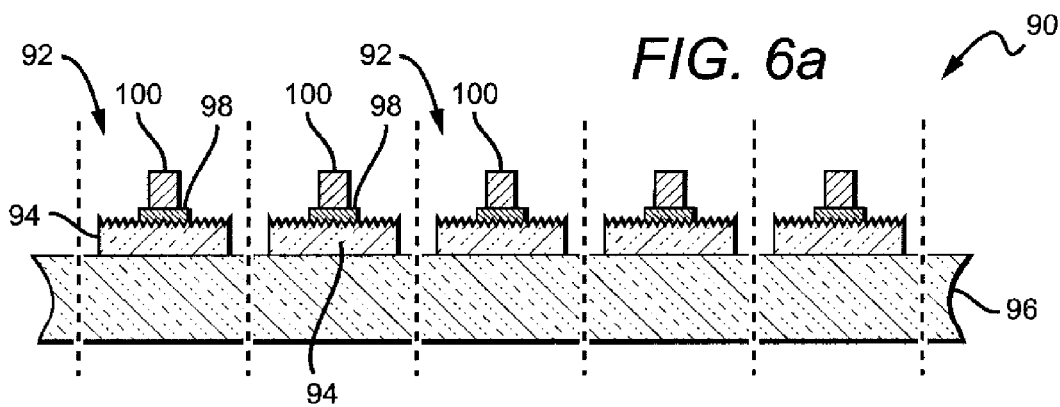
FIG. 6a is a sectional view of one embodiment of an LED chip wafer fabricated according to the present invention.

The details for fabrication of the LED wafer 90 are described in U.S. patent application Ser. Nos. 11/656,759 and 11/899,790, which are incorporated as provided above. Referring now to FIG. 6a, the LED wafer 90 comprises LEDs chips 92 shown at a wafer level of their fabrication process. Phantom lines are included to show separation or dicing line between the LED chips 92 and following additional fabrication steps. FIG. 6a shows only five devices at the wafer level, but it is understood that many more LED chips can be formed from a single wafer. For example, when fabricating LED chips having a 1 millimeter (mm) square size, up to 4500 LED chips can be fabricated on a 3 inch wafer.

Each of the LED chips 92 comprises a semiconductor LED 94 that can have many different semiconductor layers arranged in different ways as described above. As described above in method 40, the layers of the LEDs 94 generally comprise an active layer/region sandwiched between first and second oppositely doped epitaxial layers all of which can be formed or mounted to the substrate 96 at the wafer level using known methods. In the embodiment shown, the LEDs 94 are shown as separate devices on the substrate 96. This separation can be achieved by having portions of the active region and doped layers etched down to the substrate 96 to form the open areas between the LEDs 94. In other embodiments, the active layer and doped layers can remain continuous layers on the substrate 96 and can be separated into individual devices when the LED chips are singulated. The LEDs 94 can be made of different material systems as described above, and the substrate can be made of different materials. It is understood that additional layers and elements can also be included in the LED 94 and the active region 96 can comprise many different structures. The surface of the LED 94 can be textured as shown to enhance light extraction.

The LEDs 94 have vertical geometry, although it is understood that the invention is equally applicable to lateral geometry LEDs. Each of the LEDs 94 have a first contact 98 each of which is on the top surface of one of the LEDs 94 and each of which can be made of the materials described above. Each of the LEDs 94 can also comprise the current spreading layers and structures described above. An electrical signal applied to each of the first contacts 98 spreads into its respective LED. A second contact (not shown) for each of the LEDs 94 can be provided on the substrate 96 and an electrical signal applied to each of the second contacts spreads into its respective one of the LEDs 94 through the substrate 96. Electrical signals applied to the LEDs across the first and second contacts cause the LED 94 to emit light; It is understood that the present invention is equally applicable to lateral geometry LEDs having first and second contacts on the LEDs 94.

Each of the LED chips 92 further comprise a contact pedestal 100 formed on the first contact 98, each of which is utilized to make electrical contact to its respective LED 94. The pedestals 100 can be formed of many different electrically conductive materials and can be formed using many different known physical or chemical deposition processes such as electroplating, mask deposition (e-beam, sputtering), electroless plating, or stud bumping, with the preferred contact pedestal being gold (Au) and formed using stud bumping which is generally known in the art. The pedestal 100 can be made of other conductive materials beyond Au, such as the metals utilized for the first and second contacts including Cu, Ni, In, combinations thereof, or the conducting oxides and transparent conducting oxides listed above. The height of the pedestal 100 can vary depending on the desired thickness of the conversion material and should be high enough to match or extend above the top surface of the phosphor loaded binder coating from the LED.

Figure 6B:
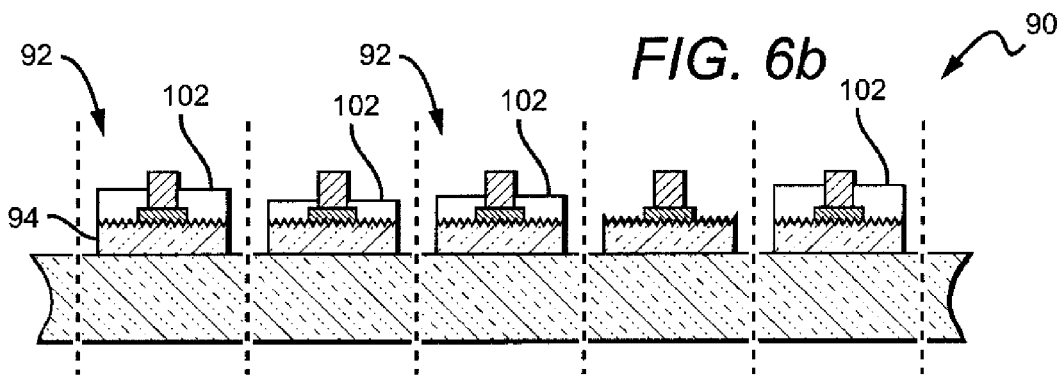
FIG. 6b is a sectional view of the LED chip wafer in FIG. 6a at a subsequent fabrication step.

The output characteristics of each of the LEDs 94 on the LED wafer 90 can be measured such as by probing as described above. A map can then be generated showing emission wavelength of the emission wavelengths of the LEDs across the wafer. As shown in FIG. 6*b*, based on the emission wavelengths of the individual LEDs 94 and the target emission wavelength for the end LED chips 92, a spacer 102 can be deposited on each of the LEDs 94. Some of the LEDs may emit light at a wavelength such that there is no need for a spacer 102, and a different spacer thickness or volume can be used for different ones of the LEDs 94.

Figure 6C:
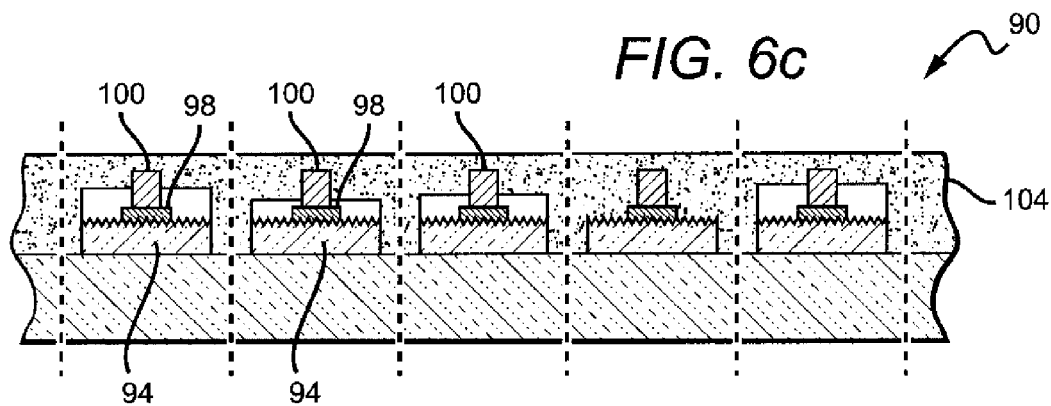
FIG. 6c is a sectional view of the LED chip wafer in FIG. 6b at a subsequent fabrication step.
Figure 6D:
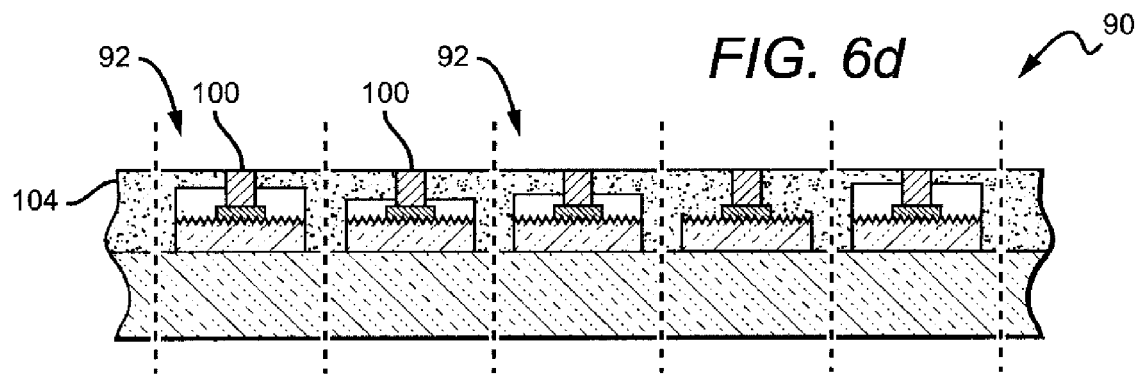
FIG. 6d is a sectional view of the LED chip wafer in FIG. 6c at a subsequent fabrication step.

Referring now to FIG. 6*c*, the LEDs 94 can be coated by a conversion material, which in this embodiment comprises a phosphor/binder coating 104 deposited using the methods described above. The phosphor/binder covers each of the LEDs 94, and its contact 98 and initially has a thickness such that it covers/buries the pedestals 100. The phosphor/binder coating 104 can then be cured using the methods described above and can comprise different binder and phosphor materials as also described above. Referring now to FIG. 6*d* after the initial coating of the LEDs, further processing may be needed such as planarization to thin the entire coating to expose the pedestals 100 or to otherwise reduce the overall thickness of the coating 104.

Once the pedestals 100 are exposed, the LED wafer 90 can be probed again and the emission characteristics of each of the LEDs chips 92 can be measured. Additional steps can be taken to remove or add conversion material to the LED chips to bring their emission wavelength closer to a target emission. It is understood, however, that the spacer layer arrangement is designed to avoid any further processing of the LED chips to achieve the desired emission, and that the LED chips should be ready for singulating following planarizing.

Figure 6E:
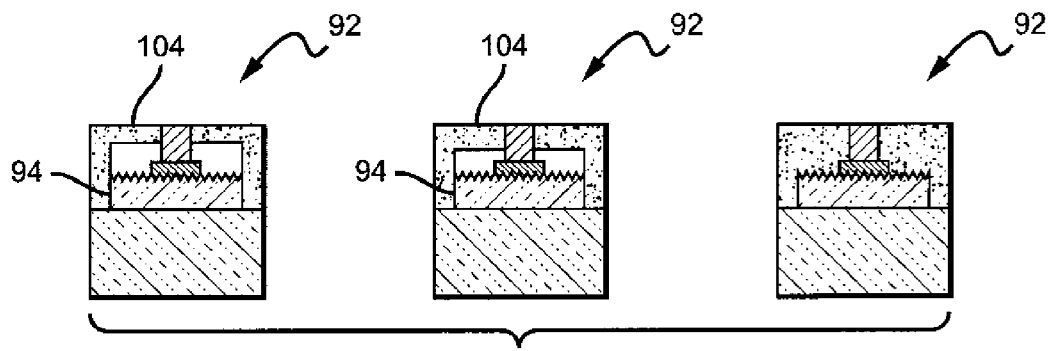
FIG. 6e is a sectional view of LED chips singulated from the LED chip wafer in FIG. 6d.

Referring now to FIG. 6*e*, the LED chips 92 can be singulated from the LED wafer 90 (as shown in FIGS. 6*a* through 6*d*) using the known processes described above, into individual devices as shown, or alternatively into groups of devices. Some of the coating 104 remains on the side surfaces of the LEDs 94 to convert LED light emitting out the side surfaces of the LEDs. This reduces or eliminates leakage of LED light from the side surfaces of the LEDs 94. The LED chips 92 can then be packaged and contacted as described above.

As mentioned above, the present invention can be used with many different LED wafer and LED chip structures. FIG. 7*a* through 7*d* show another embodiment of an LED wafer 120 according to the present invention comprising LED chips 122 that are flip-chip mounted on submount 124 at the wafer level. It is understood that this is only one type of flip-chip device and that flip-chip mounted LED chips can take many different forms and can have many different features. The LED wafer shows only two LED chips 122 with phantom lines to illustrate separation or dicing lines between the LED chips 122 following additional fabrication steps. As mentioned above, many more LED chips can be fabricated on a wafer.

Each of the LED chips 122 comprise a semiconductor LED 126 that can have many different semiconductor layers arranged in different ways as described above. The LEDs 126 generally comprise an active layer/region sandwiched between first and second oppositely doped epitaxial layers all of which are formed successively on a substrate. The present invention is particularly adapted for use with LEDs arranged so that both contacts are accessible from one surface, such as with lateral geometry LEDs. Each of the LEDs 126 further comprises first and second electrodes or contacts 130, 132 on the first and second epitaxial layers respectively. Current spreading layers and structures can be included as described above.

Each of the LED chips 122 further comprises portions of the submount 124 arranged so that the LEDs 126 can be flip-chip mounted to it. The submount 124 can be made of many different materials, such as conducting or semiconducting materials or insulating materials. Some suitable materials include ceramics such as alumina, aluminum oxide, aluminum nitride or polymide. In other embodiments the submount wafer can comprise a printed circuit board (PCB), saffire or silicon, silicon carbide, or any other suitable material, such as commercially available T-Clad thermal clad insulated substrate material. The submount wafer 124 comprises a plurality of through-holes 134 that can be formed using known processes such as etching, with two or more of the through holes 134 arranged to cooperate with a respective one of the LEDs 126. In the embodiment shown, the through-holes 134 are arranged in sets of two, with each of the sets sized and spaced to align with the first and second contacts 130, 132 of a respective one of the LEDs 126.

A dielectric layer 136 can be included covering the surface of the submount 124, including the surfaces of the through-holes 134. The dielectric layer 136 electrically insulates the wafer such that electrical signals on the surfaces of the submount 124 do not spread into the submount 124. Different materials can be used for the dielectric layer, with suitable materials being silicon nitride or silicon oxide. For submount wafers made of an insulating material such as ceramic, it may not be necessary to include the dielectric layer or electrical isolation.

Each of the through-holes 134 can be filled with a conductive material to form conductive vias 138 through the submount 124. Each of the LED chips 122 can have first and second bottom metal pads or traces 140, 142 on the bottom surface of its portion of the submount 124 that are arranged so that after dicing of the LED chips, they are electrically and physically separated by a space on the bottom surface. Each of the bottom traces 140, 142 is electrically coupled to a respective one of the vias 138. An electrical signal applied to the first bottom metal trace 140 is conducted to one of the LED chip's vias 138, with a signal applied to the second bottom metal trace 142 conducted to the other of the LED chip's vias 138. First and second top traces 144, 146 can be included on the top surface of the submount 124 for conducting signals from the vias 138 to the first and second contacts 130, 132. The LEDs 126 are mounted to the submount 124 by a conductive bond material 148, which is typically one or more bond/metal layers such as solder. The bond material typically bonds the first top trace 144 to the first contact 130 and the second top trace 146 to the second contact 132.

Figure 7A:
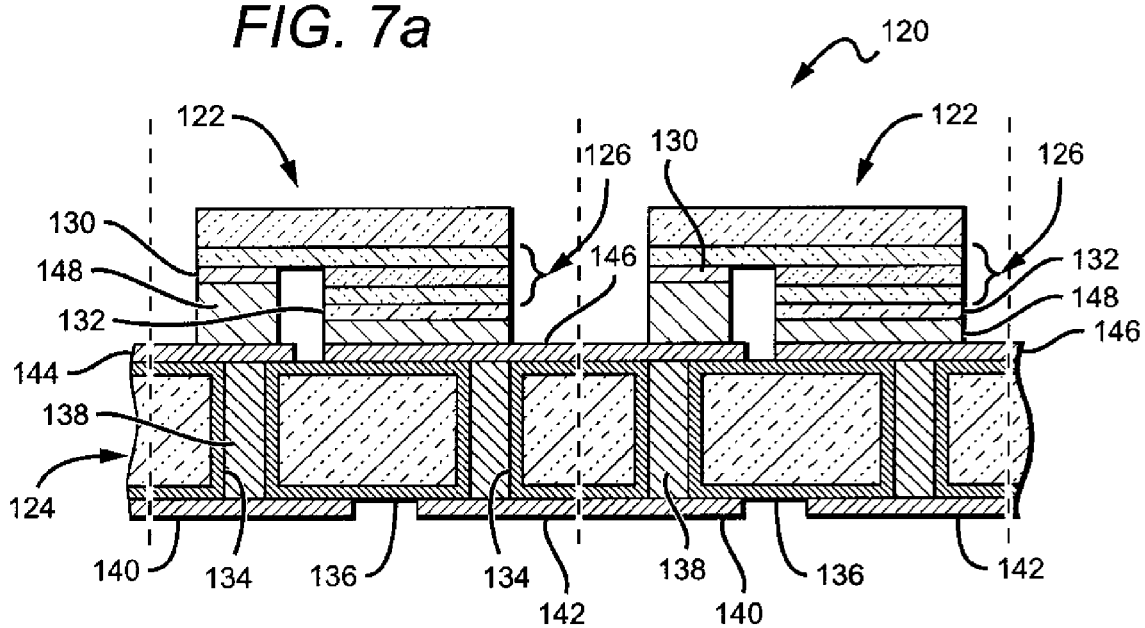
FIG. 7a is a sectional view of one embodiment of an LED chip wafer fabricated according to the present invention.
Figure 7B:
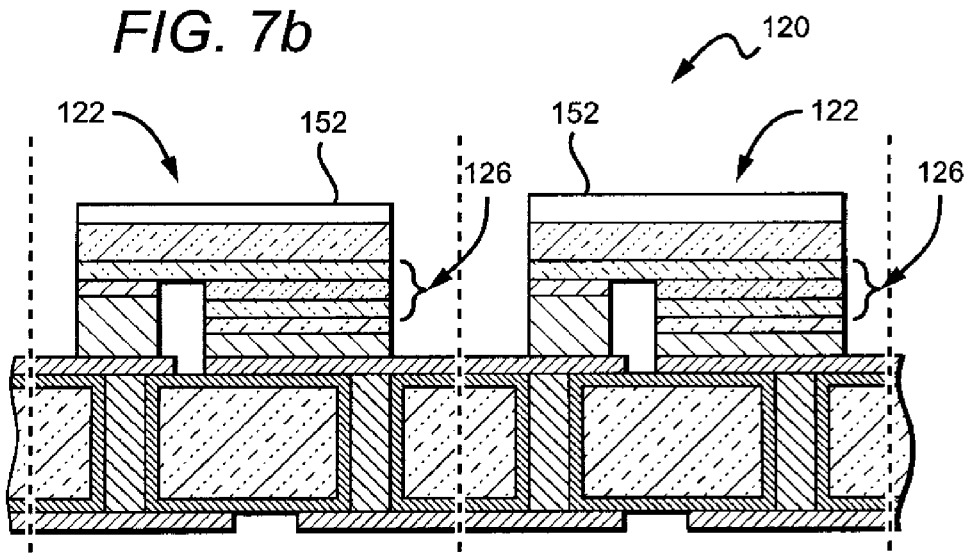
FIG. 7b is a sectional view of the LED chip wafer in FIG. 7a at a subsequent fabrication step.

The output characteristics of each of the LEDs 126 on the LED wafer 120 can be measured such as by probing as described above. A map can then be generated showing emission wavelength of the emission wavelengths of the LEDs across the wafer. Referring now to FIG. 7*b*, based on the emission wavelengths of the individual LEDs 126 and the target emission wavelength for the end LED chips 122, a spacer 152 can be deposited on some or all of the LEDs 126 to reduce the amount of conversion material that will be formed on the particular LEDs, and a different spacer thickness or volume can be used for different ones of the LEDs 126. The spacer can be formed using any one of the methods described above.

Figure 7C:
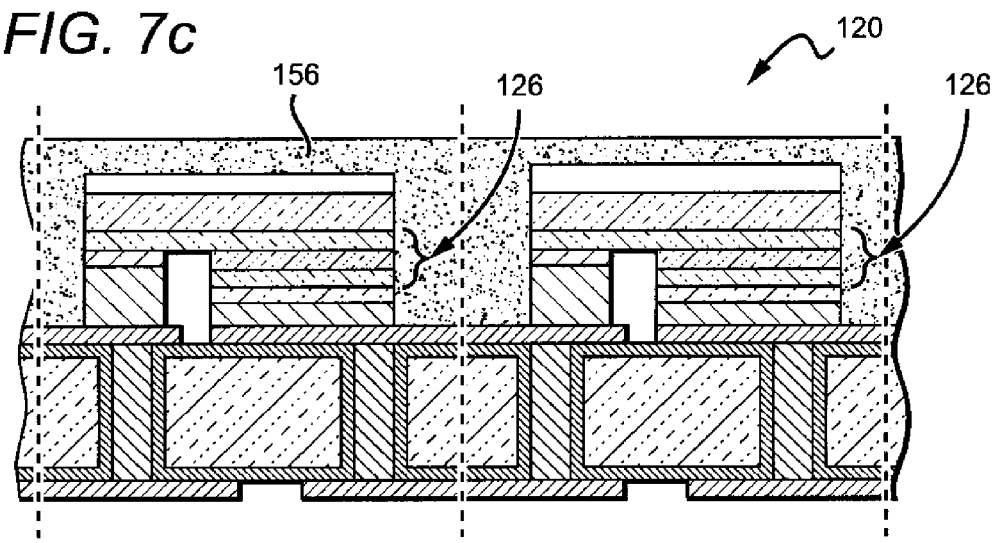
FIG. 7c is a sectional view of the LED chip wafer in FIG. 7b at a subsequent fabrication step.
Figure 7D:
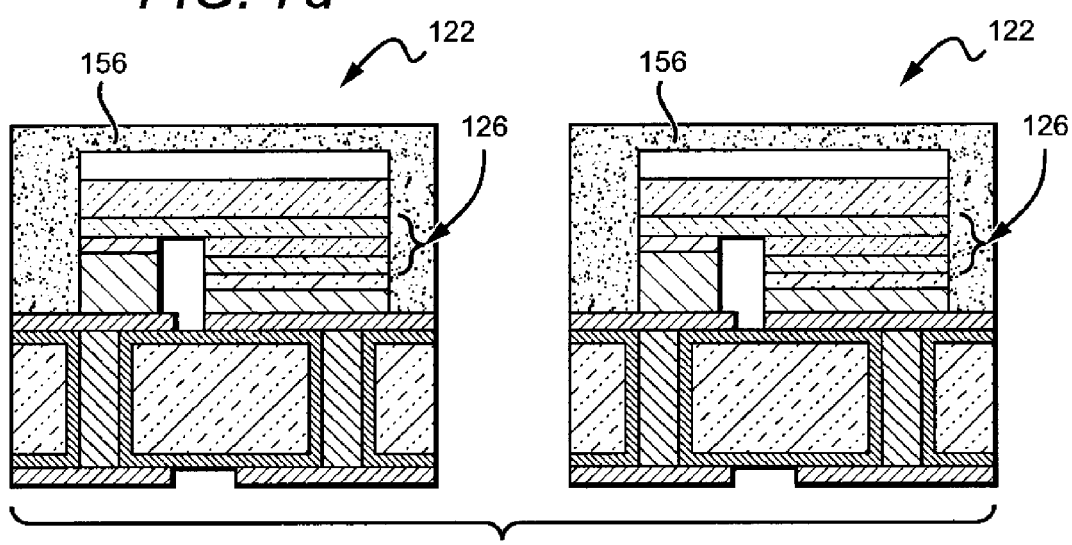
FIG. 7d is a sectional view of LED chips singulated from the LED chip wafer in FIG. 7c.

Referring now to FIG. 7c, the LED wafer 120 can be covered by a conversion material in the form of phosphor/binder coating 156 that covers the LEDs 126 for each of the LED chips 122. The phosphor binder coating can comprise the binder and phosphor materials described above and can be applied, cured and planarized as described above. As described above, the spacers 152 and planarization cooperate to leave the desired amount of conversion material over the LEDs 126 so that they emit within a standard deviation of a target wavelength. Following planarization, the LED wafer 120 is ready for singulating. In alternative embodiments the phosphor over the LEDs 126 can be further processed by measuring the output characteristics of the LEDs and altering the amount of phosphor over the LEDs as described above. Referring now to FIG. 7d, the LED chips 122 can then be singulated from the LED wafer individually or as groups of LED chips 122, with some of the coating 156 remaining on the side surfaces of the LEDs 126. The LED chips 122 can then be further packaged as described above.

Figure 8:
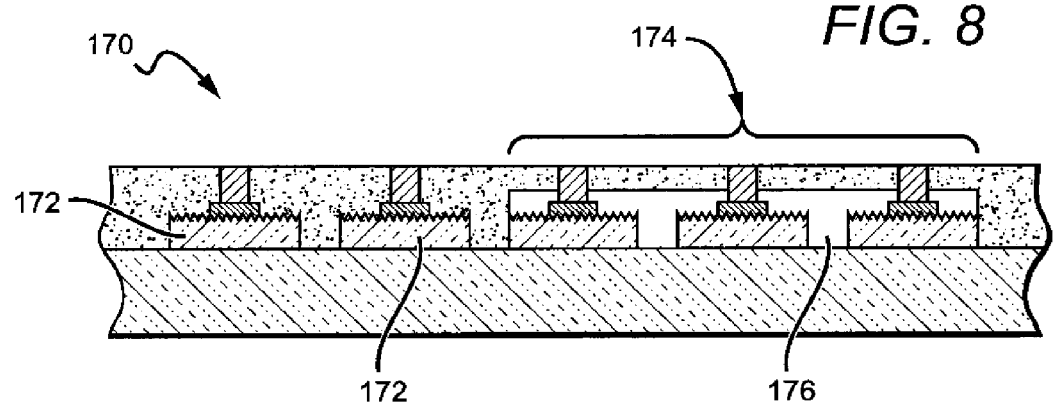
FIG. 8 is a sectional view of another embodiment of an LED chip wafer fabricated according to the present invention.

The embodiments above show spacers being applied to individual LEDs on a wafer, but it is understood that spacers of similar thickness or volume can be applied to groups of LEDs or on regions of the wafer. In some LED wafer fabrication processes the variation in emission wavelengths for the individual LEDs can be segregated to different regions on the wafer. For each of these regions, a spacer layer of substantially uniform thickness or volume can be formed on the LEDs. Referring now to FIG. 8, an LED wafer 170 is shown that is similar to LED wafer 90 shown in FIGS. 6a through 6e, and described above. The LED wafer 170 comprises LEDs 172 that emit substantially the same wavelength of light in region 174. For this region, a spacer 176 of substantially the same thickness or volume is formed over the LEDs 172. For other LEDs 172 spacers of different thickness and volume can be applied depending on the emission wavelength of the particular LEDs.

The spacers in the embodiments above are shown as substantially uniform layers on the LEDs, but it is understood that the spacers can have many different shapes and can be arranged in different ways. FIGS. 9 through 12 show just some of the different shapes that can be used for spacers according to the present invention. What each has in common is that the spacers consume a volume of space that would otherwise be filled by a conversion material. This reduces the amount of conversion material on the resulting LED chips, which corresponds to the reduction in the amount of LED light that is converted by the conversion material.

Figure 9:
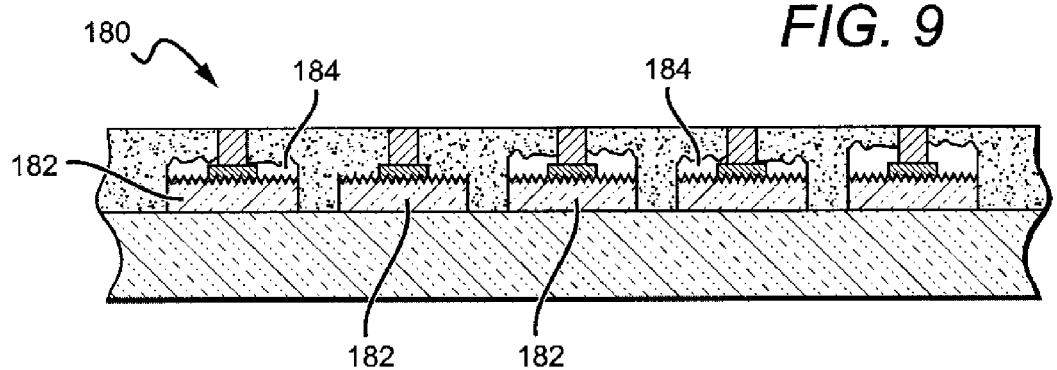
FIG. 9 is a sectional view of another embodiment of an LED chip wafer fabricated according to the present invention having a non-uniform spacer.
Figure 10:
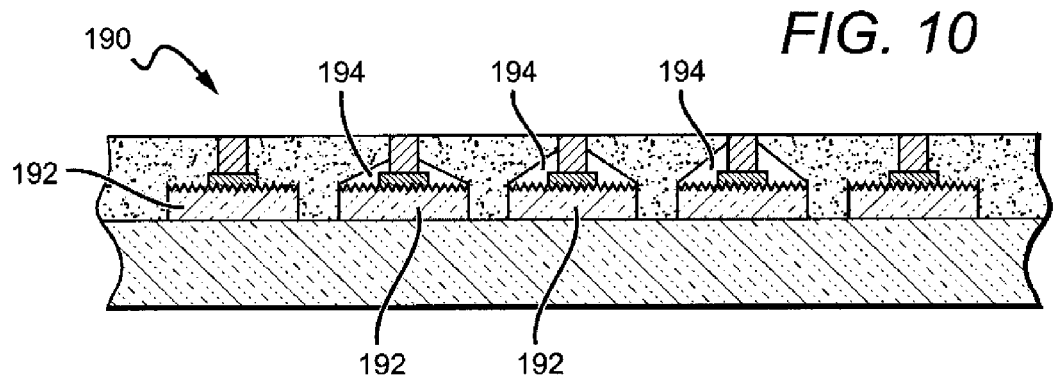
FIG. 10 is a sectional view of another embodiment of an LED chip wafer fabricated according to the present invention having pyramid shaped spacers.
Figure 11:
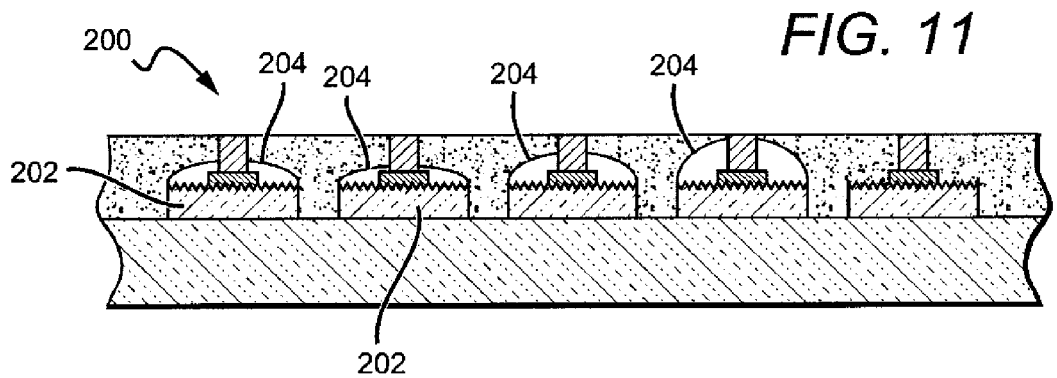
FIG. 11 is a sectional view of another embodiment of an LED chip wafer fabricated according to the present invention having hemispheric shaped spacers.
Figure 12:
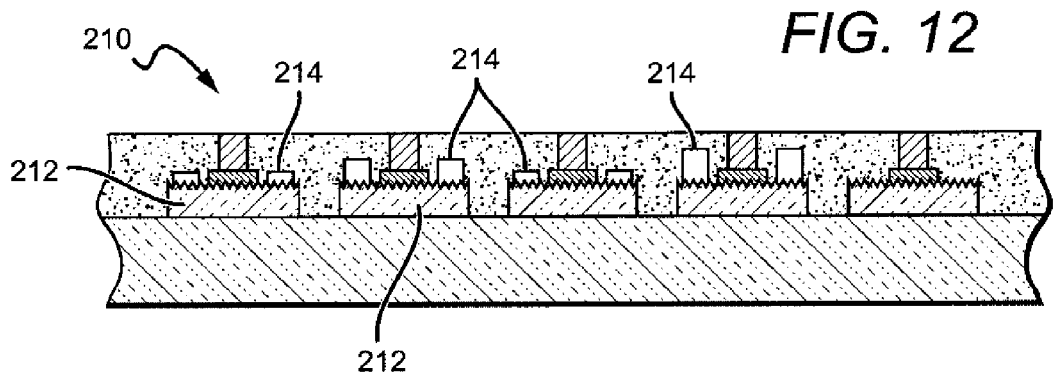
FIG. 12 is a sectional view of another embodiment of an LED chip wafer fabricated according to the present invention column shaped spacers.

FIG. 9 shows an LED wafer 180 according to the present invention that is similar to wafer 90 shown in FIGS. 6a through 6e and described above. It contains LEDs 182 and a spacer 184, but in this embodiment the spacer 184 comprises a non-uniform thickness layer on the LEDs. FIG. 10 shows another similar LED wafer 190 with LEDs 192 and a spacer 194 over the LEDs, but in this embodiment the spacer 194 has a pyramid or conical shape. FIG. 11 shows another similar LED wafer 200 with LEDs 202 and spacers 204 over the LEDs 202, with the spacers 204 being hemispheric shaped. FIG. 12 shows still another similar LED wafer 210 with LEDs 212 and spacers 214 over the LEDs 212. In this embodiment, the spacers 214 comprise one or more columns that can be different sized, and each of the LEDs can have the same or different numbers of columns.

It is understood that the spacer can be arranged in many different way beyond those described above, and that different shaped spacers can be used for the LEDs on a single wafer. Spacers according to the present invention can comprise multiple layers of different materials, and can comprise materials to enhance emission, such as scattering particles. The surface of the spacer can also be textured or shaped to further enhance light extraction.

Although the present invention has been described in detail with reference to certain preferred configurations thereof, other versions are possible. For example, the present invention can be used with many different device configurations (geometries, shape, size and other elements on, in and around the chip) to improve device performance. Therefore, the spirit and scope of the invention should not be limited to the versions described above.

I claim:

1. A method for fabricating a plurality light emitting diode (LED) chips, comprising:
   providing a plurality of LEDs;
   forming a plurality of spacers each of which is on at least one of said LEDs;
   coating said LEDs with a conversion material, each of said spacers reducing the amount of conversion material over its one of said LEDs such that each of said plurality of LED chips emits a wavelength of light in response to an electrical signal, said wavelength being within a standard deviation of a target wavelength.

2. The method of claim 1, wherein the volume of each said spacer over its one of said LEDs is related to the emission wavelength of its one of said LEDs and said target wavelength.

3. The method of claim 1, wherein said spacer comprises a material that is substantially transparent to light from said LEDs.

4. The method of claim 1, wherein said standard deviation comprises a MacAdam ellipses.

5. The method of claim 1, wherein said standard deviation corresponds to a chromaticity region on a CIE curve.

6. The method of claim 1, wherein light from each of said LED chips comprises emission from said conversion material and said LED.

7. The method of claim 1, wherein said LED chips emit white light.

8. The method of claim 1, wherein said conversion material comprises a phosphor.

9. The method of claim 1, wherein said conversion material coating comprises a phosphor in a binder.

10. The method of claim 1, further comprising measuring the emission characteristics of at least some of said LEDs prior to forming said spacer, said emission characteristics of each of said LEDs determining the volume of said spacer on that one of the LEDs.

11. The method of claim 1, wherein the volume of each of said spacers corresponds to the amount of reduction of said conversion material to cause said LED chip to emit a wavelength within said standard deviation.

12. The method of claim 1, wherein said plurality of LEDs are provided on a wafer and said LED chips are formed from said wafer.

13. The method of claim 1, further comprising singulating said LEDs from said wafer as individual LED chips or groups of LED chips.

14. The method of claim 1, further comprising planarizing said coating over said LEDs.

15. The method of claim 1, wherein one of said spacers is on a plurality of LEDs.

16. The method of claim 1, wherein each of said spacers can comprise a shape from the group consisting of uniform layer, non-uniform layer, conical, pyramid, hemispheric and columned.

17. A light emitting diode (LED) chip wafer, comprising:
a plurality of LEDs on a wafer;
a plurality of a spacers, each of with is on a least one of said LEDs; and
a conversion material at least partially covering said LEDs and spacers, with at least some light from said LEDs passing through said conversion material and is converted, wherein said spacers cause said LED chips to emit light having a wavelength within a standard deviation compared to the similar LED chips without said spacers where at least some LED chips emit light having a wavelength outside said standard deviation.

18. The LED chip wafer of claim 17, wherein the volume of each said spacer over said LEDs is related to the emission wavelength of its said LEDs and the amount reduction in said conversion material over said LEDs to cause said LED chips to emit within said standard deviation.

19. The LED chip wafer of claim 17, wherein said conversion material comprises a phosphor.

20. The LED chip wafer of claim 17, wherein said conversion material comprises a phosphor loaded binder.

21. The LED chip wafer of claim 17, further comprising a plurality of pedestals, each of which is in electrical contact with one of said LEDs, each of said pedestals exposed at the surface of said coating.

22. The LED chip wafer of claim 21, wherein electrical contact is made to said LEDs chips through said pedestals.

23. The LED chip wafer of claim 17, capable of being separated into LED chips.

24. The LED chip wafer of claim 23, wherein said LED chips comprise one of said LEDs and a portion of said conversion material, said LED chips emitting a white light combination of light from its said LED and said conversion material.

25. The LED chip wafer of claim 17, further comprising a submount, wherein said LEDs are flip-chip mounted on a surface of said submount.

26. The LED chip wafer of claim 17, wherein said spacers are transparent to light from said LEDs.

27. An light emitting diode (LED) chip, comprising:
an LED;
a spacer on said LED; and
a phosphor coating on said spacer and at least partially covering said LED so that at least some of the light emitted by said LED is converted by said phosphor, said spacer being transparent to light from said LED having a volume that consumes space that would otherwise be occupied by said conversion material, said spacer reducing the amount of phosphor coating over said LED so that said LED chip emits light at a desired wavelength.

28. The LED chip of claim 27, wherein said LED emits within a standard deviation on a CIE curve.

29. The LED chip of claim 27, emitting a white light combination of light from said LED chip and from said conversion material.

30. The LED chip of claim 27, further comprising a contact and a pedestal formed on said contact, said pedestal extending to and exposed at the surface of said coating.

31. The LED chip of claim 30, wherein an electrical signal can be applied to said LED through said pedestal.

32. The LED chip wafer of claim 27, further comprising a submount, wherein said LED is flip-chip mounted on a surface of said submount.

33. The LED chip of claim 27, wherein said coating comprises a phosphor loaded binder.

34. A light emitting diode (LED) package comprising:
an LED chip comprising an LED with a contact and a spacer, wherein said spacer is transparent to light from said LED;
a conversion coating at least partially covering said LED and spacer, said spacer having a volume that reduces the amount of phosphor coating over said LED so that said LED chip emits light at a desired wavelength;
a package lead in electrical connection with said contact; and
encapsulation surrounding said LED chip and electrical connections.

35. The LED package of claim 34, wherein said spacer is transparent to light from said LED.

36. The LED package of claim 34, wherein said desired wavelength is within a standard deviation on a CIE curve.

37. The LED package of claim 34, emitting a white light combination of light from said LED chip and from said conversion material.

38. The LED package of claim 34, further comprising a pedestal formed on said contact, said pedestal extending to and exposed at the surface of said coating.

39. The LED package of claim 34, wherein an electrical signal can be applied to said LED through said pedestal.

40. The LED package of claim 34, wherein said coating comprises a phosphor loaded binder.

* * * * *